Oct. 29, 1968

R. ORDOWER 3,408,586

FEEDBACK AMPLIFIER UTILIZING A FEED FORWARD TECHNIQUE TO ACHIEVE HIGH DIRECT CURRENT GAIN AND WIDE BANDWIDTH

Filed July 19, 1966

INVENTOR

ROBERT ORDOWER

BY John C Black

ATTORNEY

United States Patent Office 3,408,586

Patented Oct. 29, 1968

3,408,586

FEEDBACK AMPLIFIER UTILIZING A FEED FORWARD TECHNIQUE TO ACHIEVE HIGH DIRECT CURRENT GAIN AND WIDE BANDWIDTH

Robert Ordower, Vestal, N.Y., assignor to International Business Machines Corporation, a corporation of New York Filed July 19, 1966, Ser. No. 566,328

8 Claims. (Cl. 330—28)

ABSTRACT OF THE DISCLOSURE

A stable direct current feedback amplifier with a high gain bandwidth product includes a low frequency path characterized by a plurality of cascaded transistor amplifier stages and a high frequency path characterized by an emitter follower. Each stage has a high input impedance and a low output impedance. Resistors of selected value couple the output of each stage to the input of the next stage, and capacitors of selected value couple the output of the emitter follower to the second and succeeding stages to bypass succeedingly higher frequency signals around a succeedingly larger number of stages. The low voltage gain of the high frequency path (e.g. less than unity) obviates conditional stability problems encountered in the known art, and the capacitors roll off the loop gain of the amplifier at a constant predetermined slope.

This invention relates to an improved direct current amplifier which exhibits simplicity of design, high direct current gain, a high gain bandwidth product, minimized doublets, fast response to steps in input signal level and minimized conditional stability problems.

Many feedback amplifier applications require a very high direct current gain in order to obtain gain stability and accuracy and a very wide bandwidth for assuring fast response characteristics to rapid changes in the input signal levels. Known amplifiers utilize several cascaded stages in order to achieve high gain; however, in such cascaded amplifiers the two requirements of high gain and wide bandwidth are not compatible.

The broad concept of utilizing feed forward techniques in order to improve amplifier characteristics has been suggested, e.g. pp. 97–100 of "High Speed Analog Computers," by T. Karplus, published in 1962 by J. Wiley & Sons, Inc.; however, the manner in which the suggested embodiments use feed forward does not suitably achieve the desired results. So far as is known, no fully satisfactory, simplified solution has been achieved.

Accordingly, it is a primary object of the present invention to provide an improved feedback amplifier which has a high direct current gain characteristic as well as a wide bandwidth response characteristic.

It is a more specific object of the present invention to provide an improved amplifier of the type described in the preceding paragraph which utilizes an improved feed forward technique to achieve the improved gain-bandwidth response characteristics.

To the best of applicant's knowledge, some earlier attempts to develop an amplifier using feed forward have been unsuccessful due at least in part to one or more of the following problems:

(1) The loop gain of the amplifier did not roll off at a constant, predetermined slope (e.g. twenty decibels/decade). This resulted in a poor step response, even though the $F_T$ (frequency at which loop gain of the amplifier is 0 db) of the amplifier was very high;

(2) The amplifier was conditionally stable—i.e. if there is more than ninety degrees phase shift in the low frequency path, a conditional stability problem may occur.

These problems are obviated and the above objects are achieved in a preferred embodiment of the invention by providing a plurality of cascaded transistor amplifier stages with feedback being provided from the output of the last stage to the input of the first stage. The second and each succeeding stage is coupled by way of a respective capacitor and an emitter follower to the input to the first stage. Each capacitor has a preselected value such that at a predetermined frequency, the impedance of the capacitor becomes so low in relation to that of the stage which precedes the one to which it is connected that the capacitor shunts the signal around said stage. Each capacitor, as we go from stage to stage toward the output, is selected so that it bypasses the preceding stage or stages at a succeedingly higher frequency.

Thus it can be seen that a very high gain at low frequencies is attainable since the number of stages which can be cascaded without a phase build-up is theoretically unlimited. Since higher frequencies are bypassed around a succeedingly larger number of stages, the frequency response can be very high, limited essentially only by the inherent frequency response characteristics of the emitter follower and the last amplifier stage, which is not bypassed. A smooth roll-off is obtained, doublets in the frequency response being minimized by accurate pole zero cancellations.

It is therefore an important object of the present invention to provide a very economical and effective high gain, wide bandwidth direct current amplifier in which, theoretically, there is no limit to the number of stages which can be cascaded to get as high a direct current open loop gain as desired, without affecting the open loop $F_T$.

The foregoing and other objects, features and advantages of the invention will be apparent from the following more particular description of a preferred embodiment of the invention, as illustrated in the accompanying drawing.

Figures 1, 2:
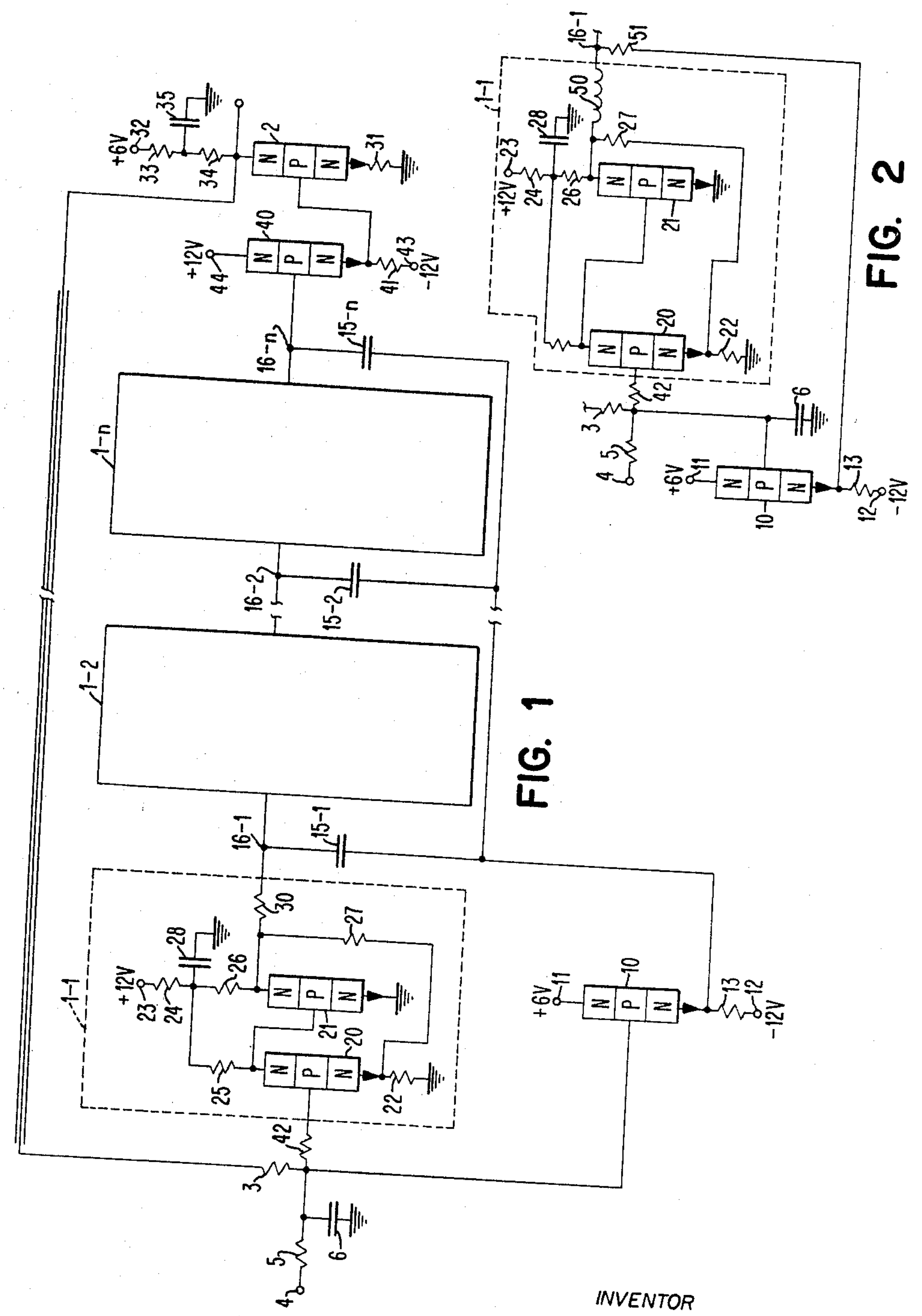
FIG. 1 illustrates a preferred form of the improved amplifier.
FIG. 2 illustrates an alternative form of the improved amplifier.

The improved amplifier illustrated in FIG. 1 includes a plurality of amplifier stages 1–1 to **1–*n*, each of which is preferably identical to the others. The output of the final stage 1–*n* is connected through a buffer stage consisting of an emitter follower 40 to a common emitter transistor amplifier 2. The collector electrode of the amplifier 2 is coupled to the input terminal of the first stage 1–1 by way of a feedback resistor 3**.

An input signal terminal 4 is coupled by way of series resistors 5 and 42 and a parallel-connected capacitor 6 to the input of the first stage 1–1 and to the base electrode of a high input impedance, emitter follower buffer amplifier 10. The collector electrode of the emitter follower is connected to a positive supply terminal 11, and its emitter electrode is connected to a negative supply terminal 12 by way of a resistor 13. Capacitors 15–1, 15–2 and **15–*n* are connected respectively to the input terminals 16–1, 16–2 and 16–*n* of the amplifier stages 1–2, 1–*n* and 2**.

The first stage 1–1 includes first and second common emitter transistor amplifiers 20 and 21. The base electrode of the transistor amplifier 20 is connected through the resistor 42 to the input signal circuit including the terminal 4, the resistor 5 and the shunt capacitor 6. The emitter electrode of the amplifier 20 is connected to ground potential by way of a resistor 22, and its collector electrode is connected to a positive supply terminal 23 by way of resistors 24 and 25.

The emitter electrode of the transistor 21 is connected to ground potential, and its collector electrode is connected to the positive supply terminal 23 by way of the resistor 24 and a resistor 26. A decoupling capacitor 28 connects the junction between the resistors 24 and 26 to ground. Negative feedback from the collector electrode of the transistor 21 to the emitter electrode of the transistor 20 is provided by way of a resistor 27. A resistor 30 connects the collector electrode of the transistor 21 to the input terminal 16–1 of the next stage.

The equivalent impedance which the capacitor 15–1 sees looking into the junction 16–1 should be well defined. This is assured in the preferred embodiment by choosing stages having a high input impedance and a low output impedance. The resistor 30 defines this equivalent impedance at the terminal 16–1 of FIG. 1, since it is in series with the relatively low output impedance of stage 1–1 and in parallel with the relatively high input impedance of stage 1–2.

In the preferred embodiment, each of the stages 1–2 to **1–*n* is similar to the stage 1–1** and will not, therefore, be described.

The emitter follower stage 40 has its emitter electrode connected to a negative supply terminal 43 by way of a resistor 41, and its collector electrode is connected to a positive supply terminal 44.

The transistor amplifier 2 has its emitter electrode connected to ground potential by way of a resistor 31, and its collector electrode is connected to a positive supply terminal 32 by way of resistors 33 and 34. A decoupling capacitor 35 connects the junction between the resistors 33 and 34 to ground potential.

Utilizing the component values set forth below, the circuit configuration of FIG. 1 obviated the problems encountered by previous unsuccessful attempts to achieve a predetermined constant slope for roll-off and assured stability with a minimum number of components. The open loop gain of the circuit was approximately six hundred-forty thousand and the loop gain $F_T$ was approximately twenty megacycles:

| | | Values |
|---|---|---|
| Resistors: | ohms | 500 |
| 3 | do | 1000 |
| 5 | do | 1200 |
| 13 | do | 25 |
| 22 | do | 22 |
| 24, 33 | do | 6000 |
| 25 | do | 4000 |
| 26, 30 | do | 1000 |
| 27 | do | 20 |
| 31 | do | 200 |
| 34 | do | 1000 |
| 41 | do | 1000 |
| 42 | | |

| | | Values |
|---|---|---|
| Capacitors: | pf | 65 |
| 6 | mfd | .37 |
| 15–1 | mfd | .0091 |
| 15–2 | pf | 224 |
| 15–*n* | mfd | .1 |
| 28, 35 | | |

FIG. 2 illustrates an alternative form which each stage such as 1–1 can take. In this form an inductor 50 and a resistor 51 replace the resistor 30 and the capacitor 15–1 of FIG. 1, respectively. The value of the impedance of the inductor increases with increasing input signal frequency, whereby at some frequency it is so much greater than the impedance of the resistor 51 that the high frequency component of the step signal is bypassed around stage 1–1 by means of the emitter follower 10 and the resistor 51.

Although the stages 1–1 to **1–*n* and the buffer amplifier 10 are shown as non-inverting amplifiers, it will be appreciated that inverting amplifiers can be used so long as the inputs to node 16–1 to 16–*n* remain in phase. Also a field effect transistor amplifier can be utilized as the buffer 10**.

Each stage of the direct current amplifier can be of the other known constructions, for example, of the differential amplifier type.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. A transistor amplifier having a high direct current gain and wide bandwidth characteristic, comprising
   an input terminal and an output terminal,
   a plurality of cascade-connected transistor voltage amplifier stages connected to the input terminal, each having a high input impedance and a low output impedance;
   an output transistor amplifier connecting the last one of said stages to the output terminal,
   means providing negative feedback between the output amplifier and the first one of said stages,
   a high input impedance buffer having its input connected to the input signal terminal and having an output; and
   means, including a first plurality of impedance elements each coupling the output of the buffer to the input of a respective one of said stages other than the first and to the output amplifier and including a second plurality of impedance elements forming output coupling for the stages, and effective to bypass progressively higher frequency components of input signals around a progressively larger number of stages.

2. The combination set forth in claim 1 wherein
   the first plurality of impedance elements comprises capacitors of selected values; and
   the second plurality of impedance elements comprises resistors of selected value.

3. The combination set forth in claim 2
   wherein each of said stages is a non-inverting amplifier including a pair of cascaded common emitter amplifiers with second-collector-to-first-emitter feedback; and
   wherein the buffer is an emitter follower.

4. The combination set forth in claim 1 wherein
   the first plurality of impedance elements comprises resistors of selected value; and
   the second plurality of impedance elements comprises inductors of selected values.

5. In a circuit of the type in which at least one voltage amplifier stage adapted to receive input signals and an output amplifier are connected in the form of a direct current feedback amplifier, the amplifier stage having an output coupled to an input of the output amplifier,
   in combination therewith a feed forward means for increasing the gain-bandwidth product of the feedback amplifier comprising
   means including a high input impedance buffer having a voltage gain less than unity and a pair of impedance elements causing high frequency components of the input signals to be bypassed around the amplifier stage to the input of the output amplifier.

6. The feedback amplifier of claim 5
   wherein the amplifier stage is of the non-inverting type having a high input impedance and a low output impedance,
   wherein the buffer comprises an emitter follower; and
   wherein one of the impedance elements is a capacitor coupling the buffer output to the output amplifier and the other impedance element is a resistor coupling the output of the amplifier stage to the output amplifier.

7. The feedback amplifier of claim 5 wherein the amplifier stage is of the non-inverting type having a high input impedance and a low output impedance, wherein the buffer comprises an emitter follower; and wherein one of the impedance elements is a resistor coupling the buffer output to the output amplifier and the other impedance element is an inductor coupling the output of the amplifier stage to the output amplifier.

8. The feedback amplifier of claim 6 further comprising a plurality of said voltage amplifier stages connected in cascade form; and a capacitor for each stage other than the first stage and a resistor for each stage output for coupling high frequency components of input signals around preceding stages.

References Cited

UNITED STATES PATENTS

| | | | |
|---|---|---|---|
| 2,781,423 | 2/1957 | Kuczun et al. | 330—126 |
| 3,281,705 | 10/1966 | Frye | 330—30 |
| 3,296,464 | 1/1967 | Brault | 330—126 X |

ROY LAKE, *Primary Examiner.*

J. B. MULLINS, *Assistant Examiner.*